US006618638B1

(12) United States Patent
Vahedi et al.

(10) Patent No.: US 6,618,638 B1
(45) Date of Patent: Sep. 9, 2003

(54) METHOD FOR SCALING PROCESSES BETWEEN DIFFERENT ETCHING CHAMBERS AND WAFER SIZES

(75) Inventors: Vahid Vahedi, Albany, CA (US); Stanley Siu, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/846,433

(22) Filed: Apr. 30, 2001

(51) Int. Cl.[7] .............................................. G06F 19/00
(52) U.S. Cl. ..................... 700/108; 194/253; 194/121; 118/715; 216/58; 216/67
(58) Field of Search .................... 438/9, 709; 700/251, 700/194; 118/715; 216/58, 67

(56) References Cited

U.S. PATENT DOCUMENTS

| | | | | |
|---|---|---|---|---|
| 5,846,443 A | * | 12/1998 | Abraham | 216/77 |
| 5,851,914 A | * | 12/1998 | Han et al. | 438/622 |
| 6,151,532 A | * | 11/2000 | Barone et al. | 700/121 |
| 2002/0146628 A1 | * | 10/2002 | Ota | 430/22 |

* cited by examiner

*Primary Examiner*—Leo Picard
*Assistant Examiner*—Michael D. Masinick
(74) *Attorney, Agent, or Firm*—Thelen Reid & Priest LLP; Thierry K. Lo

(57) ABSTRACT

A method scales plasma process settings from a first processing device to a second processing device. The first processing device has a first geometry and a first set of process parameters. The second processing device has a second geometry and a second set of process parameters. A first set of plasma process settings that generates the first set of process parameters of the first processing device having the first geometry is determined. The first set of plasma process settings is reduced to isolate at least one variable on which the first set of plasma process settings depends on for each plasma process setting. A scaling factor is calculated for each plasma process setting from the first set of plasma process settings such that the first set of process parameters substantially equals the second set of process parameters. A second set of process settings is determined for the second processing device having the second geometry by multiplying each scaling factor with each plasma process setting from the first processing device having the first geometry.

10 Claims, 5 Drawing Sheets

| Knobs | | Knob Affects |
|---|---|---|
| Pressure | $p(n_g)$ | $T_e, \tau, n_{is}$ |
| Flow Rate | $Q$ | $\tau, n_{*s}$ |
| Top Power | $P_{abs}$ | $n_{is}$ |
| Bias Power | $P_{RF}$ | $E_i$ |
| Bias Voltage | $V_{RF}$ | $E_i$ |

FIG. 3

| Process Parameters | | 9400 | 2300 (200mm) | 2300 (300mm) |
|---|---|---|---|---|
| Ion Flux | $n_{is}(\Gamma_{is})$ | $10^9$-$10^{11}$ cm$^{-3}$ | Same | Same |
| Radical Flux | $n*_s(\Gamma*_s)$ | $10^{10}$-$10^{13}$ cm$^{-3}$ | Same | Same |
| Etch Prod. Flux | $n_{eps}(\Gamma_{eps})$ | $10^{10}$-$10^{13}$ cm$^{-3}$ | Same | Same |
| Electron Temp. | $T_e$ | 2-5 eV | Same | Same |
| Ave Ion Energy | $E_i$ | 40-200 eV | Same | Same |
| Uniformity | $\sigma$ | 2-7% | Same | Same |
| Wafer Area | $A_W$ | 314 cm$^2$ | Same | x 2.25 |

| Knobs | | | | |
|---|---|---|---|---|
| Pressure | $P(n_g)$ | 7-80 mTorr | x 3/4 | x 3/4 |
| Flow Rate | $Q$ | 50-500 sccm | x 16/9 | x 16/9 |
| Top Power | $P_{abs}$ | 150-800 W | x 16/9 | x 16/9 |
| Bias Power | $P_{RF}$ | 10-400 W | ~Same | x 2.25 |
| Bias Voltage | $V$ | 50-600 V | ~Same | ~Same |

FIG. 5

METHOD FOR SCALING PROCESSES BETWEEN DIFFERENT ETCHING CHAMBERS AND WAFER SIZES

FIELD OF THE INVENTION

The present invention relates to plasma etching. More particularly, the present invention relates to a method for scaling processes between different plasma etch chambers as well as different wafer sizes.

BACKGROUND OF THE INVENTION

Reactive ion etching and plasma etching are commonly used in the industry. A plasma having specific properties will yield a specific process result on a wafer. In order to obtain the desired process result, the characteristics of the plasma must be identified and controlled. A plasma is generally characterized by its properties (e.g. electron temperature, ion density, neutral density, etc). These plasma properties are generally controlled by process "knobs", such as RF power, chamber pressure, gas flow, etc. However, the effects of these process knobs may vary depending on the specific geometry of the each chamber and the size of each wafer.

Current process transfer between different generations and classes of etch chambers rely on running large design of experiments (DOEs) in each chamber and comparing process results. The next step of the process transfer would match the process results and compare the process windows of each chamber. This qualitative matching would then result in a process transfer between the etch chambers. Typically, a "process match" is qualitative in nature because the process results such as etch rate, selectivity, etc do not all match together, but are close enough for the user's specific application. Therefore, many wafers are processed and discarded in order to match the process results.

In a true process transfer, the important etch parameters such as electron temperature, ion density, neutral density, ion energy, residence time, etc. would be matched in each chamber. Once the plasma properties are matched, the process results should also match. Unfortunately, with the current methodology, there is no assurance that this occurs.

The difficulty in determining scaling factors arises from the coupled nature of plasma. Changing one process knob usually affects many plasma characteristics. For example, changing the pressure will not only change the electron temperature but also the ion density, the residence time, and other parameters.

Accordingly, a need arises for a quantitative method for scaling processes between different etching chambers and wafer sizes, to match the important etching parameters in each chamber.

BRIEF DESCRIPTION OF THE INVENTION

A method scales plasma process settings from a first processing device to a second processing device. The first processing device has a first geometry and a first set of process parameters. The second processing device has a second geometry and a second set of process parameters. A first set of plasma process settings that generates the first set of process parameters of the first processing device having the first geometry is determined. The first set of plasma process settings is reduced to isolate at least one variable on which the first set of plasma process settings depends on for each plasma process setting. A scaling factor is calculated for each plasma process setting from the first set of plasma process settings such that the first set of process parameters substantially equals the second set of process parameters. A second set of process settings is determined for the second processing device having the second geometry by multiplying each scaling factor with each plasma process setting from the first processing device having the first geometry.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 3 is a table illustrating the effects of knobs setting on the plasma properties;

FIG. 5 is a table illustrating an example of scaling factors between different classes of etching chambers and wafer sizes according to a specific embodiment of the present invention.

DETAILED DESCRIPTION

Embodiments of the present invention are described herein in the context of a method for scaling processes between different classes of plasma etch chambers as well as different wafer sizes. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
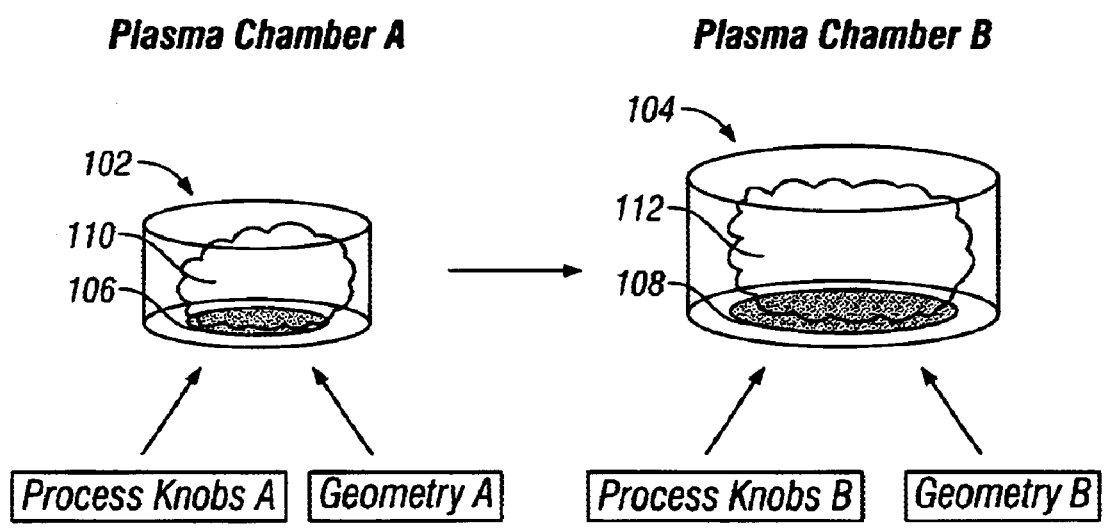
FIG. 1 is a schematic of two different classes of plasma chambers with different wafer sizes.

FIG. 1 is a schematic representation of two different classes of plasma chamber A and B, 102 and 104 respectively. The plasma chamber 102 has a wafer 106. The plasma chamber 104 has a wafer 108. A plasma field 110 is generated within chamber 102. A plasma field 112 is generated within chamber 104. Both plasma fields 110 and 112 have characteristics that are dependent upon the process settings or process knobs and the geometry of chambers 102 and 104, and size of wafers 106 and 108 respectively. For example, the plasma field 110 generated in chamber 102 is affected by the process settings, the geometry of the chamber 102, and the size of the wafer 106. In some situations, the wafer sizes 106 and 108 or the chamber geometry 102 and 104 may be the same; for example, etching the same size wafer in different class chambers or etching different sized wafers in same class chambers.

Plasma fields having the same characteristics will generally yield the same process result on a wafer. However, because the geometry of chamber 104 is different from chamber 102 and the wafer size 108 is different from the wafer size 106, the process settings will be also different. In order to scale the process settings from the plasma chamber 102 to the plasma chamber 104 to match the characteristics of both plasma fields 110 and 112, it must be understood how the process settings and the geometry of a chamber both affect the characteristics of a plasma field in that chamber.

Figure 2:
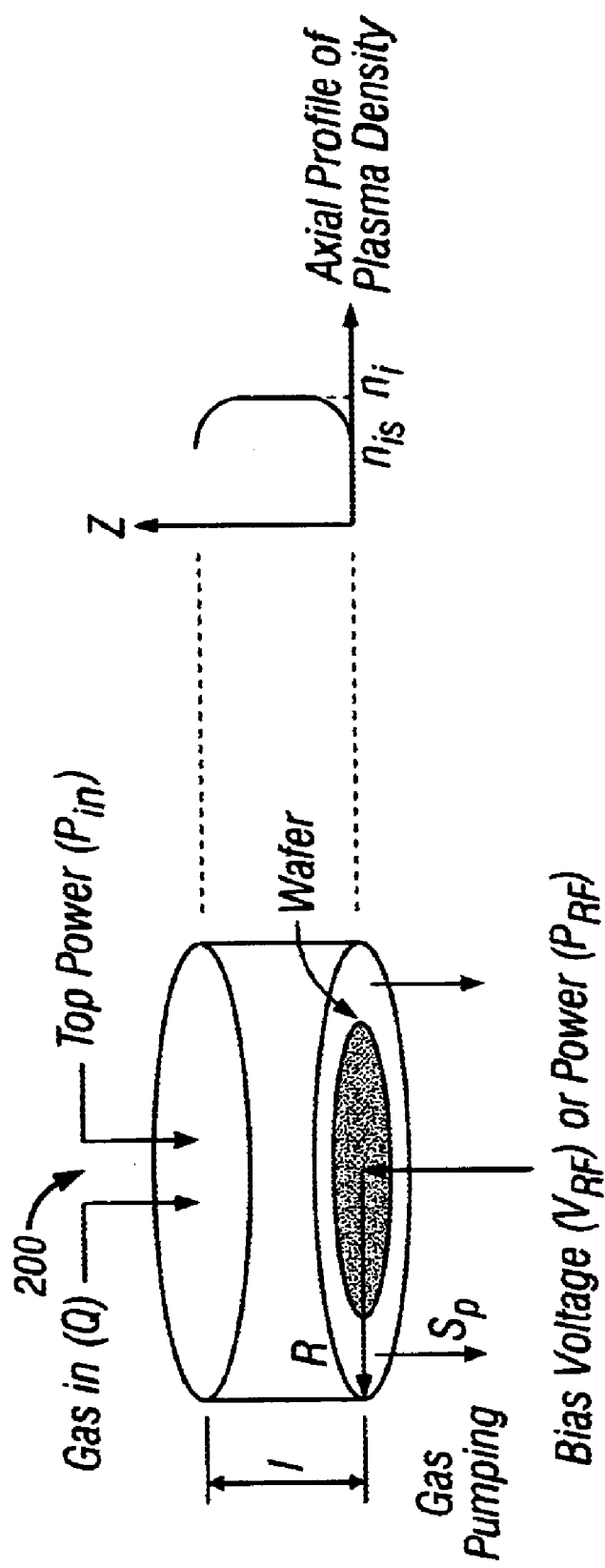
FIG. 2 is a schematic diagram of a chamber illustrating how important process parameters affect the plasma field within that chamber.

FIG. 2 is a schematic diagram of a chamber 200 showing how important process parameters affect the plasma field within chamber 200. Certain parameters affects the characteristics of a plasma field. For example, chamber 200 has a geometry defined by its chamber height (l), chamber radius (R), chamber cross-sectional area (A) (not shown). Important process parameters are the ion flux ($n_{is}$), the radical flux ($n_{*s}$), the etch production flux ($n_{eps}$), the electron temperature ($T_e$), the average ion energy ($E_i$), the uniformity ($\sigma$), and the wafer area ($A_w$). Some of the process settings that affect the characteristics of the plasma field within chamber 200 are gas pressure (p), gas flow rate (Q), top power ($P_{ABS}$), bias power ($P_{RF}$), and bias voltage ($V_{RF}$).

The plasma field within a plasma chamber is generally controlled by the process knobs or process settings. FIG. 3 is a table showing the effects of the process settings in the plasma chamber. A change in the pressure (p) setting affects the electron temperature ($T_e$), the residence time $\tau$ and the ion flux ($n_{is}$). A change in the gas flow rate (Q) setting affects both the residence time $\tau$ and the radical flux ($n_{*s}$). A change in the top power ($P_{ABS}$) setting also affects the ion flux ($n_{is}$).

Figure 4:
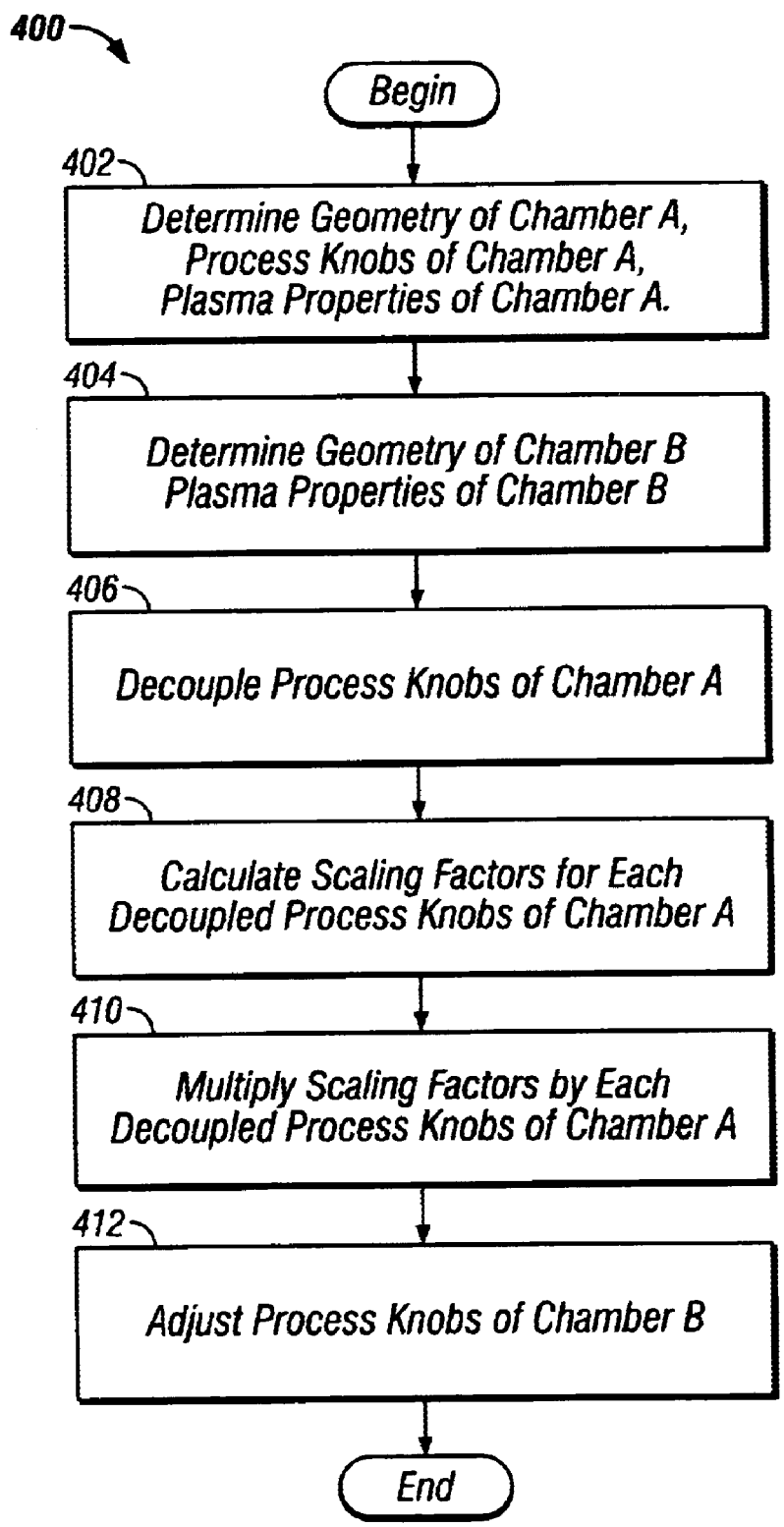
FIG. 4 is a flow diagram of a method for scaling processes between different classes of etching chambers and wafer sizes according to a specific embodiment of the present invention.

In order to scale the process settings from one class of chamber to another, the characteristics such as the geometry of both chambers must be first determined. FIG. 4 illustrates a flow diagram 400 for a method for scaling processes between different classes of etching chambers and wafer sizes, such as both plasma chambers 102 and 104 and wafer sizes 106 and 108. In a first block 402, the geometric characteristics of plasma chamber 102 are first determined. Such geometry factors may include the chamber height (l), chamber radius (R), chamber cross-sectional area (A), and the wafer area ($A_w$). The process settings of plasma chamber 102 are then determined; such process settings may include gas pressure (p), gas flow rate (Q), top power ($P_{ABS}$), bias power ($P_{RF}$), and bias voltage ($V_{RF}$).

These process settings along with the specific geometry of plasma chamber 102 affect the characteristics and effects of the plasma field 110 on the wafer 106 within the plasma chamber 102.

In a block 404, the characteristics of the second plasma chamber 104 are then determined. For example, the plasma chamber 104 may have different geometrical characteristics from plasma chamber 102. In order to scale the plasma process between plasma chamber 102 and 104, the plasma characteristics of both chambers need to be the same. In a true process transfer, the important etch parameters such as electron temperature, ion density, neutral density, ion energy, residence time, etc. would be matched in each chamber. Once the plasma is matched, the process results should also match. Therefore the properties of the plasma field 112 in chamber 104 need to be essentially similar to the properties of the plasma field 110 in chamber 102.

A zeroth order model is derived from first principle analytic equations describing the plasma properties in an etch chamber. These equations (Lieberman & Lichtenberg) are well known and describe the effect of area and volume on the plasma parameters such as the electron temperature, the ion density, and the neutral density. Further equations couple the process knobs such as TCP or top power, chamber pressure, and gas flow that affect the plasma properties. Combining all the equations gives predictions of scaling factors. However, the difficulty in determining scaling factors arises from the coupled nature of plasma. Changing one process knob may change multiple plasma characteristics. The decoupling process in block 406 effectively decouples these effects to generate accurate scaling factors. The plasma process settings are reduced to isolate at least one variable on which they depend on. The following example illustrates the decoupling process in block 406.

Based on the assumption that plasma generation is non-local, the ion mass balance equation yields:

$$K_{iz} n_g n_i A l = 2 n_{is} u_B A \qquad \text{(Equation 1)}$$

where $K_{iz}$ represents the ionization frequency, $n_g$ represents the gas density of neutrals, $n_i$ represents gas density of ions, A represents the chamber's cross-sectional area, l represents the chamber's height, $n_{is}$ represents the ion flux, $u_B$ represents the Bohm velocity (the velocity of the ions leaving the plasma sheath). Because $n_{is} = h_l n_i$, substituting these expressions into Equation 1 yields:

$$K_{iz}(T_e)/u_B(T_e) = 2 h_l / l \cdot n_g \qquad \text{(Equation 2)}$$

The electron temperature $T_e$ is isolated and can therefore be determined in terms of the geometry of the plasma chamber.

The input power balance equation describes the top power as follows:

$$P_{abs} = 2 A e E_T n_{is} u_B \qquad \text{(Equation 3)}$$

where $P_{abs}$ represents the top power, A represents the chamber's cross-sectional area, e represents the charge of an electron, $E_T$ represents the ratio of energy lost over the number of ion created, $n_{ii}$ represents the ion flux, and $u_B$ represents the Bohm velocity.

By modifying Equation 3, the ion flux can be determined and expressed in terms of the following equation:

$$n_{is} = P_{abs}/(2 A e E_T u_B) \qquad \text{(Equation 4)}$$

Assuming there is a reactive gas and for illustration purposes, suppose the gas is $O_2$, ignoring the negative ions, the gas in both chambers 102 and 104 reacts as follows:

$$e^- + O_2 \xrightarrow{K_{dis}} 2O + e^- \quad \text{(Equation 5)}$$

in which free radicals are produced. This reaction can be characterized in terms of the following equation:

$$AlK_{dis}n_g n_i = S_p n_{*s} + 0.5cA\gamma n_{*s} \quad \text{(Equation 6)}$$

where A represents the chamber's cross-sectional area, l represents the chamber's height, $K_{dis}$ represents the dissociation constant, $n_g$ represents the gas density of neutrals, $n_i$ represents gas density of ions, $S_p$ represents the pumping speed, $n_{*s}$ represents the radical flux, and $\gamma$ represents the sticking coefficient of etching species to the chamber walls. $n_{*s}$ can therefore be defined as follows:

$$n_{*s} = \frac{AlK_{dis}(T_e)n_g n_i}{S_p + 0.5cA\gamma} \quad \text{(Equation 7)}$$

The residence time $\tau$ can be described in terms of the volume chamber V, the pressure p, and the flow rate Q as follows:

$$\tau \sim pV/Q \quad \text{(Equation 8)}$$

By assuming that all the bias power $P_{RF}$ is used to extract the ions, the bias power can be expressed as follows:

$$P_{RF} \sim l_i V = A_w e n_{is} u_B E_i \quad \text{(Equation 9)}$$

where $l_i$ represents RF current, V represents RF voltage, $A_w$ represents the wafer area, e represents the charge of the electron, $n_{is}$ represents the ion flux, $u_B$ represents the Bohm velocity, and $E_i$ represents the ion energy.

In order to scale between two classes of plasma chambers, the aspect ratio should be kept constant.

$$R_1 = C_R R_2 \quad \text{(Equation 10)}$$

$$l_1 = C_l l_2 \quad \text{(Equation 11)}$$

$$A_1 = C_A A_2 \quad \text{(Equation 12)}$$

where $R_1$ represents the chamber radius of a first plasma etch system, $R_2$ represents the chamber radius of a second plasma etch system, $l_1$ represents the chamber height of the first plasma etch system, $l_2$ represents the chamber height of the second plasma etch system, $A_1$ represents the chamber cross-sectional area of the first plasma etch system, $A_2$ represents the chamber cross-sectional area of the second plasma etch system, and $C_R$, $C_l$, $C_A$ are constants.

For illustration purposes, the scaling between a first etch system having a chamber radius R2300, chamber height l2300, and chamber cross-sectional area A2300 to another etch system having a chamber radius R9400, chamber height l9400, and chamber cross-sectional A9400, may yield the following aspect ratio:

$$R_{2300} \approx \frac{4}{3} R_{9400} \quad \text{(Equation 10a)}$$

$$l_{2300} \approx \frac{4}{3} l_{9400} \quad \text{(Equation 11a)}$$

$$A_{2300} = \frac{16}{9} A_{9400} \quad \text{(Equation 12a)}$$

Because the same parameters are desired in both etch chambers for resulting in the same etching process, the electron temperature $T_e$ in both systems needs to be the same. In order to have the same electron temperature $T_e$ in Equation 2, the product of the chamber height l by the gas density of neutrals $n_g$ must be kept constant. Therefore based on Equation 11 and the fact that $ln_g$ must be kept constant, it is determined that:

$$n_{g2300} = \frac{3}{4} n_{g9400} \quad \text{(Equation 13)}$$

Thus, the pressure knob setting in the 2300 etch system should be scaled to ¾ of the pressure knob setting in the 9400 etch system:

$$P_{2300} = \frac{3}{4} p_{9400} \quad \text{(Equation 14)}$$

By holding $ln_g$ constant, the term $1/\lambda_i$ remains the same as well. Therefore, the plasma uniformity $\sigma$ is approximately the same over the wafer. Since the same plasma properties are desired in both plasma chambers, the time residence $\tau$ must also be kept constant. Based on Equation 8 and Equation 12, the following expression is derived:

$$Q_{2300} = 16/9 Q_{9400} \quad \text{(Equation 15)}$$

In situations where the etch is more chemically driven, the flow scaling ratio may be on the order of 1 to preserve the etch rates:

$$Q_{2300} = Q_{9400} \quad \text{(Equation 15a)}$$

By keeping the plasma density constant in Equation 4, and using the relationship of the chamber cross-sectional area between both systems as described in Equation 12, the following expression is derived:

$$P_{abs2300} = 16/9 P_{abs9400} \quad \text{(Equation 16)}$$

To keep the same plasma density and ion energy, the bias power $P_{RF}$ scales with the wafer area $A_w$ as follows:

$$P_{RF2300}(\text{for 200 mm wafers}) = P_{RF9400} \quad \text{(Equation 17)}$$

$$P_{RF2300}(\text{for 300 mm wafers}) = C_4 P_{RF9400} \quad \text{(Equation 18)}$$

where $C_4$ is the ration of the wafer areas. For illustration purposes, $C_4$ may be 2.25.

Running in voltage control, it is determined that the bias voltage for both etch systems is approximately the same:

$$V_{2300}(\text{for 200 mm}) \sim V_{9400} \quad \text{(Equation 19)}$$

$$V_{2300}(\text{for 300 mm}) \sim V_{9400} \quad \text{(Equation 20)}$$

The table in FIG. 5 summarizes the theoretical predictions produced by the process in block 408 of FIG. 4. In FIG. 5, the important parameter s that need to be the same are listed with their range values for each etching system. The table illustrates an example for an etching system 9400 and 2300 using 200 mm wafers, and 2300 using 300 mm wafers. The table also lists the ranges for the knob settings for an etching system 9400 and the respective scaling factors for the other etching systems.

In block 410, the process knob settings are scaled accordingly using the scaling factors produced in block 408. That is, the process knob settings of the first system are multiplied by scaling factors to obtain the process knob settings of the second system. For example, to obtain the same parameters of a plasma field in both the 9400 series and the 2300 series, the pressure setting between both etch system should be scaled by ¾. The flow rate setting should be scaled by 16/9. The top power should be scaled by 16/9. The bias power setting should be the same for the 2300 series processing a 200 mm wafer. The bias power setting should be scaled by 2.25 for the 2300 series processing a 300 mm wafer. The bias voltage setting should be the same.

However, several effects cause deviations from the theoretical scaling factors. The electron temperature depends on the geometry of the plasma etching chamber. For example, the chamber is not a perfect cylinder because of the liners that are used to confine the plasma. The plasma density may also deviate from the theoretical prediction of the scaling factors; the coil size and shape of the plasma chamber, the matching efficiency, and the true chamber geometry all affect the plasma density. The liner and anodization types also affect the neutral density of the plasma in the chamber. The matching efficiency and voltage probe accuracy and matching also affect the ion energy of the plasma in the chamber. The coil type and diameter may differ affecting the ion density of the plasma in the chamber and hence the top power scaling factor.

Once the scaling factors are determined in block 410 of FIG. 4, these scaled process knobs settings are adjusted in block 412 because of deviations from the theoretical results.

The electron temperature $T_e$ depends on the pressure within the chamber. Scaling the pressure from one class of chamber to another (see equation 14) will also scale the electron temperature $T_e$. A Langmuir probe may be used for measurement verification or determination of the actual scaling factor.

Once the electron temperature $T_e$ is scaled, the ion density $n_i$ scaling is verified or determined by performing plasma density measurements with SPORT wafer in both chambers to determine TCP scaling with pressure scaling. For example, for the same ion density, TCP of a 2300 etch system at 9 mT=k TCP of a 9400 etch system at 12 mT.

After the electron temperature $T_e$ and ion density $n_i$ are scaled using pressure and TCP, the flow of gas is then scaled using etches that are chemical or neutral driven such as but not limited to resist ashing, aluminum etching with molecular chlorine, or oxide etch with flourine. Etch rate tests with different coverage are also used to determine flow scaling. By scaling the flow rate, the scaling of the neutral density can be determined.

The ion energy is scaled by using the same plasma in each chamber. Oxide sputter rate tests are run to determine the scaling factor for either bottom power or bottom voltage. If the scaling of the electron temperature, ion density, neutral density, and ion energy are done properly, then the etching results should match, and the product flux will be scaled by default.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for scaling plasma process settings from a first processing device having a first geometry and a first set of process parameters, to a second processing device having a second geometry and a second set of process parameters, the method comprising:

determining a first set of plasma process settings that generates the first set of process parameters of the first processing device having the first geometry;

reducing said first set of plasma process settings to isolate at least one variable on which said first set of plasma process settings depends for each plasma process setting;

calculating a scaling factor for each plasma process setting from said reduced first set of plasma process settings such that the first set of process parameters substantially equals the second set of process parameters; and determining a second set of process settings for the second processing device having the second geometry by multiplying said scaling factor with each plasma process setting from the first processing device having the first geometry.

2. The method according to claim 1, further comprising adjusting said second set of process settings to match the first set of process parameters with the second set of process parameters.

3. A method for scaling plasma process settings from a first processing device having a first geometry and a first set of process parameters, to a second processing device having a second geometry and a second set of process parameters, the method comprising:

determining a first set of plasma process settings that generates the first set of process parameters of the first processing device having the first geometry;

reducing said first set of plasma process settings to isolate at least one variable on which said first set of plasma process settings depends for each plasma process setting;

calculating a scaling factor for each plasma process setting from said reduced first set of plasma process settings such that the first set of process parameters substantially equals the second set of process parameters; and determining a second set of process settings for the second processing device having the second geometry by multiplying said scaling factor with each plasma process setting from the first processing device having the first geometry, wherein said first geometry further comprises a chamber radius, a chamber height, a chamber aspect ratio, a chamber cross-sectional area, and a wafer area.

4. A method for scaling plasma process settings from a first processing device having a first geometry and a first set of process parameters, to a second processing device having a second geometry and a second set of process parameters, the method comprising:

determining a first set of plasma process settings that generates the first set of process parameters of the first processing device having the first geometry;

reducing said first set of plasma process settings to isolate at least one variable on which said first set of plasma process settings depends for each plasma process setting;

calculating a scaling factor for each plasma process setting from said reduced first set of plasma process settings such that the first set of process parameters substantially equals the second set of process parameters; and determining a second set of process settings for the second processing device having the second geometry by multiplying said scaling factor with each plasma process setting from the first processing device having the first geometry, wherein said second geometry further comprises a chamber radius, a chamber height, a chamber aspect ratio, a chamber cross-sectional area, and a wafer area.

5. The method according to claim 1, wherein the first set of process settings further comprises a pressure, a flow rate, a top power, and a bottom power.

6. The method according to claim 1, wherein the second set of process settings further comprises a pressure, a flow rate, a top power, and a bottom power.

7. A method for scaling plasma process settings from a first processing device having a first geometry and a first set of process parameters, to a second processing device having a second geometry and a second set of process parameters, the method comprising:

determining a first set of plasma process settings that generates the first set of process parameters of the first processing device having the first geometry;

reducing said first set of plasma process settings to isolate at least one variable on which said first set of plasma process settings depends for each plasma process setting;

calculating a scaling factor for each plasma process setting from said reduced first set of plasma process settings such that the first set of process parameters substantially equals the second set of process parameters; and determining a second set of process settings for the second processing device having the second geometry by multiplying said scaling factor with each plasma process setting from the first processing device having the first geometry, wherein said first set of process parameters further comprises an ion flux, a radical flux, an etch production flux, an electron temperature, an average ion energy, and a uniformity.

8. A method for scaling plasma process settings from a first processing device having a first geometry and a first set of process parameters, to a second processing device having a second geometry and a second set of process parameters, the method comprising:

determining a first set of plasma process settings that generates the first set of process parameters of the first processing device having the first geometry;

reducing said first set of plasma process settings to isolate at least one variable on which said first set of plasma process settings depends for each plasma process setting;

calculating a scaling factor for each plasma process setting from said reduced first set of plasma process settings such that the first set of process parameters substantially equals the second set of process parameters; and determining a second set of process settings for the second processing device having the second geometry by multiplying said scaling factor with each plasma process setting from the first processing device having the first geometry, wherein said second set of process parameters further comprises an ion flux, a radical flux, an etch production flux, an electron temperature, an average ion energy, and a uniformity.

9. A method for scaling plasma process settings from a first processing device having a first geometry and a first set of process parameters, to a second processing device having a second geometry and a second set of process parameters, the method comprising:

determining a first set of plasma process settings that generates the first set of process parameters of the first processing device having the first geometry;

reducing said first set of plasma process settings to isolate at least one variable on which said first set of plasma process settings depends for each plasma process setting;

calculating a scaling factor for each plasma process setting from said reduced first set of plasma process settings such that the first set of process parameters substantially equals the second set of process parameters; and determining a second set of process settings for the second processing device having the second geometry by multiplying said scaling factor with each plasma process setting from the first processing device having the first geometry, wherein said reducing further comprises:
assuming non-local plasma generation;
determining an electron temperature using an ion mass balance equation;
determining an ion flux using an input power balance equation;
determining a radical flux using a free radical production equation;
determining a residence time using a residence time equation; and
determining a bottom power using a bias power balance equation.

10. The method according to claim 9, wherein calculating a scaling factor further comprises:

determining said pressure using said ion mass balance equation by keeping said electron temperature constant;

determining said flow rate using said residence time equation by keeping said residence time constant;

determining said top power using said input power balance equation by keeping said ion flux constant; and determining said bottom power using said bias power balance equation.

* * * * *

UNITED STATES PATENT AND TRADEMARK OFFICE
CERTIFICATE OF CORRECTION

PATENT NO. : 6,618,638 B1
DATED : September 9, 2003
INVENTOR(S) : Vahid Vahedi and Stanley Siu It is certified that error appears in the above-identified patent and that said Letters Patent is hereby corrected as shown below:

<u>Title page,</u>
Item [*] Notice, replace "0 days." with -- 138 days. --.

<u>Column 4,</u>
Lines 41-42, replace "represent s" with -- represents --.
Line 58, "$n_{ii}$" with -- $n_{is}$ --.

<u>Column 5,</u>
Line 40, equation 11, replace "$l_1=C_1l_2$" with -- $l_1=C_l l_2$ --.

<u>Column 6,</u>
Line 52, replace "parameter s" with -- parameters --.

Signed and Sealed this

Second Day of March, 2004

JON W. DUDAS
*Acting Director of the United States Patent and Trademark Office*